United States Patent
Umezawa et al.

(10) Patent No.: US 12,083,722 B2
(45) Date of Patent: Sep. 10, 2024

(54) METHOD FOR MANUFACTURING FILM-FORMED MOLDED PRODUCT

(71) Applicant: MITSUBA Corporation, Gunma (JP)

(72) Inventors: Takao Umezawa, Gunma (JP); Hitoshi Konuma, Gunma (JP); Mitsunori Sato, Gunma (JP)

(73) Assignee: MITSUBA Corporation, Gunma (JP)

( * ) Notice: Subject to any disclaimer, the term of this patent is extended or adjusted under 35 U.S.C. 154(b) by 203 days.

(21) Appl. No.: 17/420,715

(22) PCT Filed: Dec. 24, 2019

(86) PCT No.: PCT/JP2019/050500
§ 371 (c)(1),
(2) Date: Jul. 5, 2021

(87) PCT Pub. No.: WO2020/145123
PCT Pub. Date: Jul. 16, 2020

(65) Prior Publication Data
US 2022/0105667 A1 Apr. 7, 2022

(30) Foreign Application Priority Data
Jan. 11, 2019 (JP) .................................. 2019-003263

(51) Int. Cl.
*B29C 45/16* (2006.01)
*B29C 45/00* (2006.01)
(Continued)

(52) U.S. Cl.
CPC ........ *B29C 45/162* (2013.01); *B29C 45/0053* (2013.01); *B29C 45/0416* (2013.01);
(Continued)

(58) Field of Classification Search
None
See application file for complete search history.

(56) References Cited

U.S. PATENT DOCUMENTS

| | | | |
|---|---|---|---|
| 4,131,530 A * | 12/1978 | Blum | C23C 14/205 |
| | | | 204/192.15 |
| 7,740,783 B2 * | 6/2010 | Ishizawa | F21S 41/37 |
| | | | 425/134 |
| 2009/0297880 A1 * | 12/2009 | Maruoka | C23C 14/0015 |
| | | | 428/209 |

FOREIGN PATENT DOCUMENTS

| JP | 2006274444 | 10/2006 |
|---|---|---|
| JP | 2006305804 | 11/2006 |

(Continued)

OTHER PUBLICATIONS

Machine translation of JP2009154402A, Jul. 16, 2009 (Year: 2009).*

(Continued)

*Primary Examiner* — Benjamin A Schiffman
(74) *Attorney, Agent, or Firm* — JCIPRNET

(57) ABSTRACT

The present invention achieves cost reduction by simplifying the manufacturing process for a film-formed molded product provided with a metal coating film capable of transmitting electromagnetic waves therethrough. This method for manufacturing a film-formed molded product which includes a molded product and a metal coating film covering the molded product comprises: forming the molded product between a movable mold and a fixed mold; and then forming the metal coating film which covers the molded product by a film-forming part of a second mold without taking the molded product out from between the movable mold and the fixed mold. The metal coating film is capable of transmitting electromagnetic waves therethrough as a result of generation of cracks after being formed.

7 Claims, 10 Drawing Sheets

(51) Int. Cl.
  *B29C 45/04* (2006.01)
  *B29C 45/06* (2006.01)
  *B29C 45/14* (2006.01)
  *C23C 14/34* (2006.01)
  *C23C 14/50* (2006.01)
  *B29L 9/00* (2006.01)
  *B29L 31/34* (2006.01)

(52) U.S. Cl.
  CPC ...... *B29C 45/062* (2013.01); *B29C 45/14778* (2013.01); *B29C 45/1618* (2013.01); *B29C 45/1635* (2013.01); *B29C 45/1671* (2013.01); *C23C 14/34* (2013.01); *C23C 14/505* (2013.01); *B29C 2045/0079* (2013.01); *B29C 2045/1673* (2013.01); *B29K 2995/0003* (2013.01); *B29L 2009/008* (2013.01); *B29L 2031/3456* (2013.01)

(56) References Cited

FOREIGN PATENT DOCUMENTS

| | | | | | |
|---|---|---|---|---|---|
| JP | 2009099489 | A * | 5/2009 | ......... | B29C 45/0062 |
| JP | 2009154402 | | 7/2009 | | |
| JP | 2010005999 | | 1/2010 | | |
| JP | 2011058048 | | 3/2011 | | |
| JP | 2015038236 | | 2/2015 | | |
| JP | 2016065269 | | 4/2016 | | |
| KR | 20130028864 | A * | 9/2012 | ............ | C23C 14/34 |
| WO | 2004101254 | | 11/2004 | | |
| WO | 2006098302 | | 9/2006 | | |
| WO | 2018061250 | | 4/2018 | | |
| WO | 2018169062 | | 9/2018 | | |
| WO | WO-2020145123 | A1 * | 7/2020 | ......... | B29C 45/0053 |

OTHER PUBLICATIONS

"Search Report of Europe Counterpart Application", issued on Aug. 24, 2022, p. 1-p. 7.

"International Search Report (Form PCT/ISA/210) of PCT/JP2019/050500," mailed on Mar. 24, 2020, with English translation thereof, pp. 1-4.

"Office Action of China Counterpart Application", issued on Jul. 21, 2022, with English translation thereof, p. 1-p. 14.

* cited by examiner

METHOD FOR MANUFACTURING FILM-FORMED MOLDED PRODUCT

CROSS-REFERENCE TO RELATED APPLICATION

This application is a 371 application of an international PCT application serial no. PCT/JP2019/050500, filed on Dec. 24, 2019, which claims the priority benefit of Japan application no. 2019-003263, filed on Jan. 11, 2019. The entirety of each of the above-mentioned patent applications is hereby incorporated by reference herein and made a part of this specification.

BACKGROUND

Background of the Invention

Field of the Invention

The present invention relates to a method for manufacturing a film-formed molded product having electromagnetic wave transmission.

Description of Related Art

A conventional vehicle periphery monitoring device may be mounted with a distance measuring sensor (for example, a millimeter wave radar) using an electromagnetic wave at left and right corners or the like of a bumper in the front of a vehicle. The distance measuring sensor is attached to an outer surface of the corner of the bumper, and if the distance measuring sensor detects an obstacle, the distance measuring sensor warns a driver. When this distance measuring sensor is arranged in a central part in the front of the vehicle, it is conceivable to arrange the distance measuring sensor in a gap, a front surface, or the like of a front grille. However, in this arrangement of a radar, the radar is exposed and can be visually recognized from the outside, and thus there is a problem that a designability of the vehicle deteriorates.

Thus, a mounting method has been examined in which the distance measuring sensor is arranged on a back side of the film-formed molded product (for example, an emblem) arranged in the front of the vehicle, but a conventional metal coating film formed on the surface of the film-formed molded product has a property of blocking the electromagnetic wave emitted by the distance measuring sensor. On the other hand, Patent literature 1 (Japanese Patent Laid-Open No. 2015-38236) describes that cracks are formed on a metal thin film covering the surface of a base material for the purpose of forming the metal coating film having excellent electromagnetic wave transmission. In addition, Patent literature 2 (Japanese Patent Laid-Open No. 2011-58048) describes that a temperature of a product taken out from a molding machine is maintained and the product is moved into a film-forming device main body to coat a thin film.

BRIEF SUMMARY OF THE INVENTION

When the film-formed molded product such as the above emblem or the like is manufactured by preparing the molding machine and the film-forming device are and transferring a molded product formed by a mold in the molding machine into the film-forming device to perform film formation, an equipment for transporting the molded product and a cleaning device for cleaning (static elimination air cleaning) a molded product before being film-formed are required. In addition, a yield is reduced due to facts that the molded product absorbs moisture, the molded product is electrically charged, dust adheres to the molded product, and the like. In order to prevent this problem from occurring, it is necessary to prepare a clean room, and if the molding machine, the film-forming device, the transporting equipment, and the cleaning equipment are included, the equipment for forming the film-formed molded product is large-scale, and a manufacturing cost of the film-formed molded product is increased.

In addition, when the cracks are generated on the metal thin film to form the metal coating film having high electromagnetic wave transmission, the metal coating film is formed on the heated molded product by a sputtering method or the like, and then the cracks are formed by cooling the molded product. Therefore, during the transportation of the molded product from the molding machine into the film-forming device, a process of keeping the temperature of the molded product or raising (heating) the temperature of the molded product, and a process of reducing the pressure in the film-forming device or the like are required, which causes the manufacturing process to be complicated and the manufacturing cost of the film-formed molded product to be increased.

A purpose of the present invention is to provide a method for manufacturing a film-formed molded product having excellent electromagnetic wave transmission, and the method for manufacturing a film-formed molded product can achieve cost reduction by simplifying a manufacturing equipment and a manufacturing process of the film-formed molded product.

A method for manufacturing a film-formed molded product of the present invention is a method for manufacturing a film-formed molded product which includes a non-conductive first molded product and a metal coating film covering the first molded product, including: a process in which the first molded product molded between a first mold and a second mold is formed; and a process in which the metal coating film is formed on a surface of the first molded product by a first film-forming part included in the second mold. The metal coating film has an electromagnetic wave transmission performance due to cracks generated after the metal coating film is formed.

According to the method for manufacturing a film-formed molded product of the present invention, because the molding and the film-forming are completed in the same mold, an equipment required fort the manufacturing can be miniaturized, the absorption of moisture in the molded product, the generation of static electricity in the molded product, and the adhesion of dust to the molded product can be prevented, and a vacuum state for the film-forming can be easily created. Therefore, the manufacturing process of the film-formed molded product having excellent electromagnetic wave transmission can be simplified and the manufacturing cost can be reduced.

DETAIL DESCRIPTION OF THE INVENTION

Figure 1:
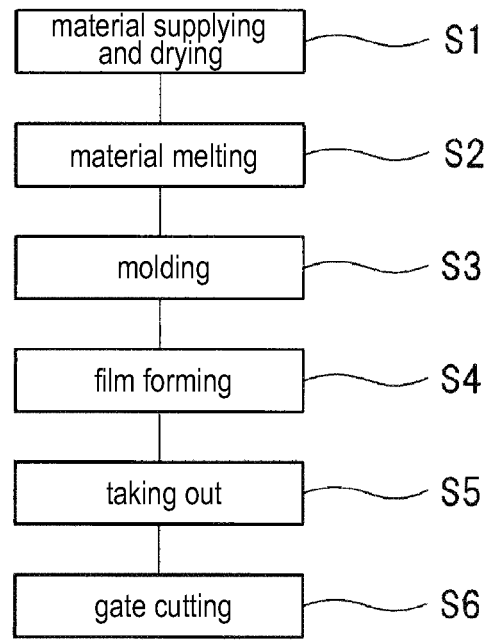
FIG. 1 is a manufacturing flow of a film-formed molded product according to Embodiment 1 of the present invention.

Hereinafter, embodiments of the present invention are described in detail with reference to the drawings. Moreover, in all the drawings for describing the embodiments, members having the same function are designated by the same reference signs, and repeated descriptions thereof are omitted. In addition, in the following embodiments, descriptions of the same or similar parts are not repeated in principle unless it is particularly necessary. In addition, in the drawings for describing the embodiments, in order to make the configuration easy to understand, a hatching may be added even in a plan view or a perspective view. Furthermore, in the drawings for describing the embodiments, in order to make the configuration easy to understand, the hatching may be omitted in a cross-sectional view.

Embodiment 1

Hereinafter, a method for manufacturing a film-formed molded product (a coating film molded product) is described with reference to the drawings by using an emblem for vehicle as an example, but the present invention is not limited hereto. Here, a method for manufacturing the emblem for vehicle is described on which a metal coating film (a metal thin film) capable of transmitting an electromagnetic wave emitted by a radar is covered on the surface, and in the method for manufacturing the emblem for vehicle, both a molding process of this emblem and a film-forming process of the metal coating film are performed in the same mold.

<Method for Manufacturing Film-Formed Molded Product>

Hereinafter, the method for manufacturing a film-formed molded product of the embodiment is described with reference to FIGS. 1 to 8. FIG. 1 is a manufacturing flow of the film-formed molded product of the embodiment. FIGS. 2 to 7 are cross-sectional views of the film-formed molded product during of the embodiment a manufacturing process. FIG. 8 is a top view transparently showing a part of a vehicle to which the film-formed molded product of the embodiment is attached. In FIG. 8, a radar attached to the inside of the vehicle is transparently shown.

Here, the method for manufacturing a film-formed molded product is described along the flow shown in FIG. 1.

In the manufacturing process of the film-formed molded product of the embodiment, first, a material is supplied (step S1 in FIG. 1). That is, a material used for molding the film-formed molded product is supplied to a manufacturing device of the film-formed molded product (hereinafter, simply referred to as the manufacturing device). Here, for example, a molded product is formed using polycarbonate as the material. The manufacturing device includes a movable mold 1 and a fixed mold 2 shown in FIG. 2, and further includes a cylinder (not shown) for injecting this material into a gap between the movable mold 1 and the fixed mold 2 when these molds are fitted to each other. In addition, the manufacturing device includes a hopper (not shown) which is a container for supplying this material to this cylinder. In step S1 in FIG. 1, first, for example, a granular material (pellet) is supplied to a drying drum or the like and is dried using this drying drum or the like. Here, a purpose of drying the material is to prevent air or moisture in the material from exploding due to heat during the molding process and causing an abnormality on the surface of the molded product, and the like. Here, a case where the polycarbonate is used as this material is described, but this material also may be other organic materials such as acrylic resin (PMMA) and the like. The molded product molded by this material is a non-conductive object.

Next, the dried material is supplied into the cylinder via the hopper, and the material is heated and melted in the cylinder (step S2 in FIG. 1). The cylinder has a function of sending the material out into the mold (injection function), and a heater for heating the material in the cylinder is installed around the cylinder. A temperature of the material melted in the cylinder is 100° C. or higher. The inside of the mold in the present application does not mean the inside of one mold of the movable mold 1 or the fixed mold 2 shown in FIG. 2, but means a region clamped between a plurality of molds (here, the movable mold 1 and the fixed mold 2).

Figure 2:
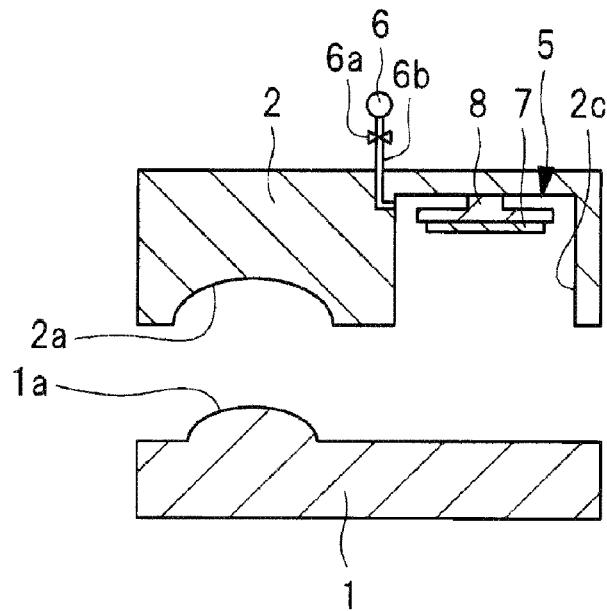
FIG. 2 is a cross-sectional view of the film-formed molded product according to Embodiment 1 of the present invention during a manufacturing process.
Figure 3:
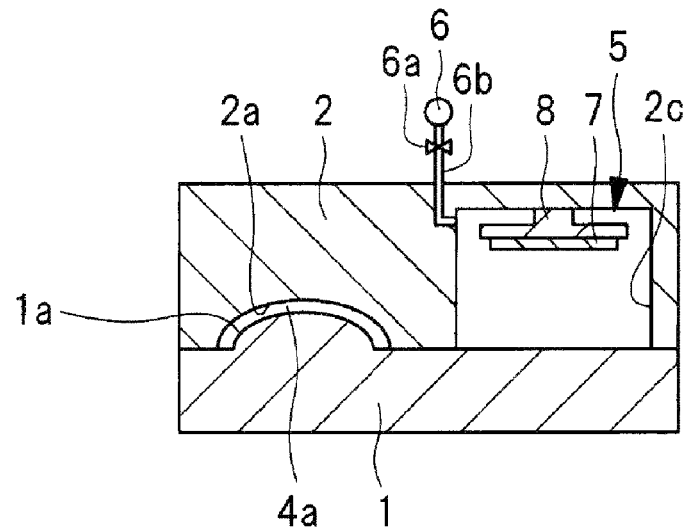
FIG. 3 is a cross-sectional view of the film-formed molded product during the manufacturing process following FIG. 2.
Figure 4:
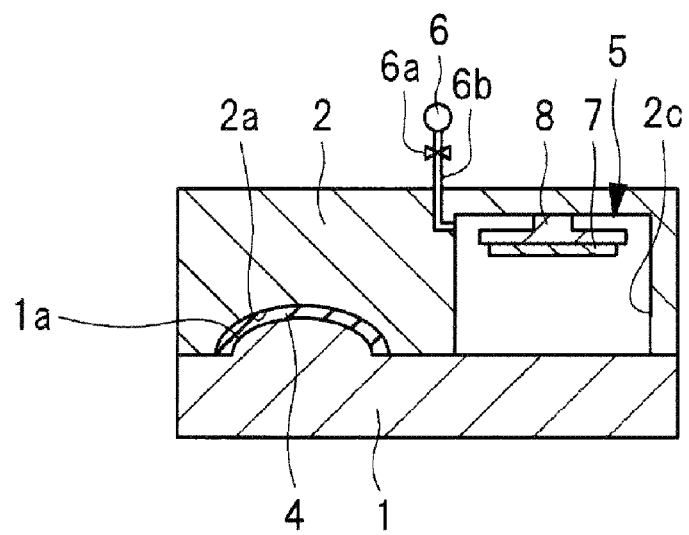
FIG. 4 is a cross-sectional view of the film-formed molded product during the manufacturing process following FIG. 3.

Next, in a state where the movable mold 1 and the fixed mold 2 shown in FIG. 2 are fitted as shown in FIG. 3, that is, in a state where the mold-clamping is performed, the melted material is injected into a gap (space) 4a between the movable mold 1 and the fixed mold 2 to perform molding (step S3 in FIG. 1). Thereby, a molded product 4 shown in FIG. 4 is formed. At this time, a temperature of each of the movable mold 1 and the fixed mold 2 is, for example, 80 to 95° C. The injection molding process is specifically described below.

The movable mold (first mold) 1 shown in FIGS. 2 to 4 is configured to be capable of separately moving in an opposite direction with respect to the fixed mold (second mold) 2 and moving in a direction along a surface facing the fixed mold 2 in a state of being separated from the fixed mold 2 (parallel movement). Moreover, because the movement of the molds may be relative, a configuration in which the movable mold 1 is fixed and the fixed mold 2 is moved may be used, or a configuration in which both the movable mold 1 and the fixed mold 2 are moved may be used. In addition, as long as the movement is performed in a direction along the surface, the movement is not limited to the parallel movement in the linear direction and may be a rotational movement centered on an axis. The rotation of the mold is described in Modification example 2 of Embodiment 2 described later.

A convex mold surface 1a for forming an outer surface of the molded product (workpiece) 4 is formed on one surface (upper surface) of the movable mold 1 facing the fixed mold 2. In addition, a concave mold surface 2a for forming an inner surface of the molded product 4 and a concave mold surface 2c for accommodating (internally mounting) a sputtering device 5 which is a film-forming part (a film-forming device or a film-forming way) are formed side by side on one surface (lower surface) of the fixed mold 2 facing the movable mold 1. The convex mold surface 1a and the concave mold surface 2a constitute a molding part.

A known sputtering device is arranged as the sputtering device 5. Schematically, the sputtering device 5 includes a vacuum pump 6, a vacuum flow path 6b connected to the vacuum pump 6 via an on-off valve 6a, a target 7 made of a metal which is a film-forming material (raw material), and a stage 8 for fixing (arranging) the target 7. Moreover, because the target 7 is a replaceable film-forming material, the target 7 can also be considered not to be a constituent element of the sputtering device 5. The metal constituting the target 7 is, for example, stainless steel (SUS), chromium (Cr), aluminum (Al), or the like. The molded product 4 is a base material of the emblem arranged in the front of the vehicle (automobile), for example, in a central part of a front grille.

FIG. 2 shows a state in which the movable mold 1 and the fixed mold 2 are separated from each other and face each other. That is, the convex mold surface 1a and the concave mold surface 2a forming the molded product 4 (see FIG. 4) face each other in a state of being separated from each other (a state of being mold-opened). As shown in FIG. 3, by moving the movable mold 1 to the fixed mold 2 side from the separated state, the convex mold surface 1a and the concave mold surface 2a facing each other are mold-clamped (mold-matched). In the mold-clamped state, the material is injected into a gap 4a between the convex mold surface 1a and the concave mold surface 2a, and the material is cooled in a state of being applied with a pressure until the material is hardened. As shown in FIG. 4, by cooling and harden the material, the molded product 4 made of this material is molded.

Figure 5:
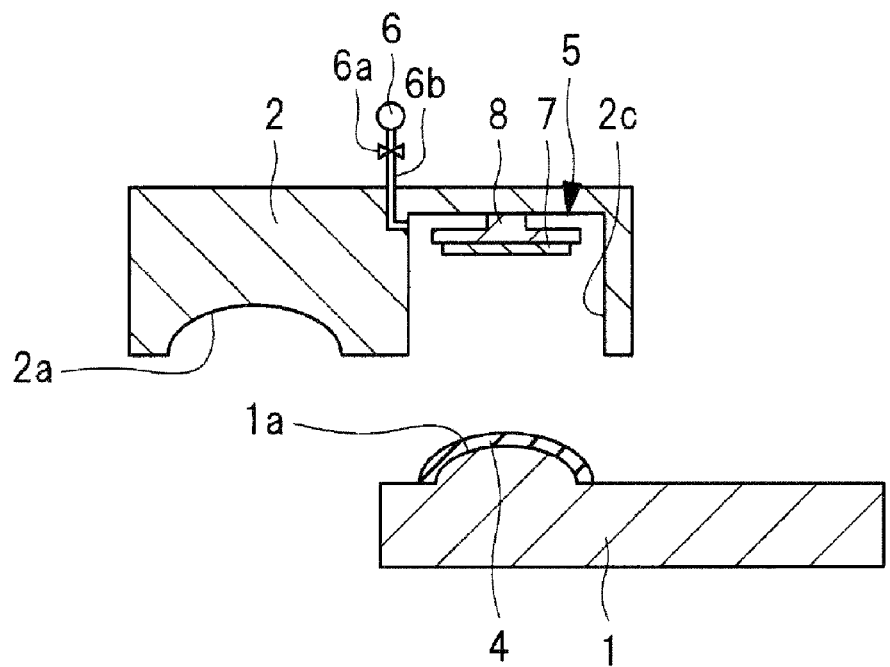
FIG. 5 is a cross-sectional view of the film-formed molded product during the manufacturing process following FIG. 4.

Next, the metal coating film is formed on the surface of the molded product 4 by using the film-forming part (step S4 in FIG. 1). That is, first, as shown in FIG. 5, a mold release (mold opening) process is performed in which the movable mold 1 moves in a direction where the movable mold 1 is mold-released from the fixed mold 2 (the mold is opened). At this time, the mold is designed in a manner that the molded product 4 is supported on the movable mold 1 side without being removed from the mold. That is, the molded product 4 comes into contact with the convex mold surface 1a and remains on the movable mold side. Subsequently, the movable mold 1 moves in parallel in a manner that the molded product 4 faces the sputtering device 5. In other words, by moving the movable mold 1, the molded product 4 moves relatively with respect to the fixed mold 2 in a region between the movable mold 1 and the fixed mold 2. At this time, the molded product 4 moves directly below the concave mold surface 2c.

Figure 6:
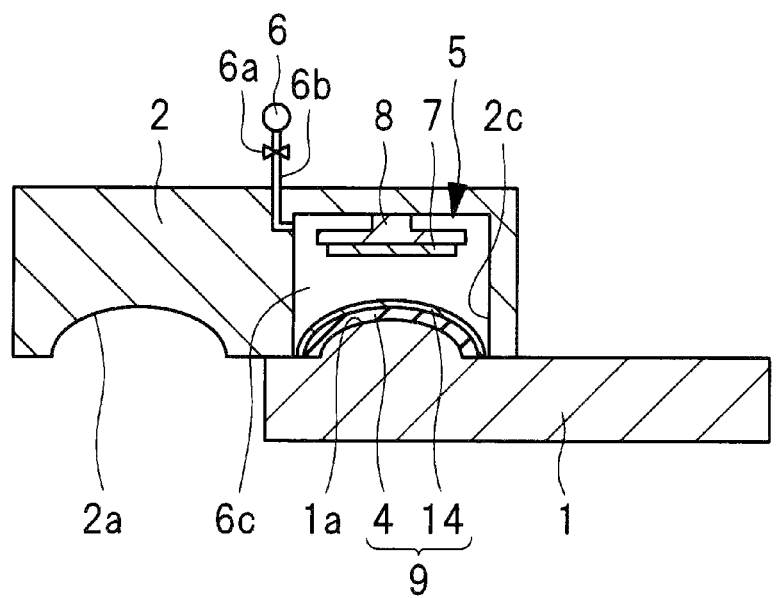
FIG. 6 is a cross-sectional view of the film-formed molded product during the manufacturing process following FIG. 5.

Subsequently, as shown in FIG. 6, the movable mold 1 and the fixed mold 2 are in a mold-clamped state by moving the movable mold 1 to the fixed mold 2 side, and a film-forming space 6c between the inside of the concave mold surface 2c and the molded product 4 is isolated from outside air and sealed. The film-forming space 6c is an enclosed space surrounded by the movable mold 1 and the concave mold surface 2c of the fixed mold 2 in a manner that the movable mold 1 and the fixed mold 2 are in close contact with each other.

Subsequently, the on-off valve 6a is opened to remove air in this film-forming space 6c through the vacuum flow path 6b, and thereby the inside of the film-forming space 6c is made a vacuum state. At this time, an atmospheric pressure in the film-forming space 6c is, for example, $10^{-2}$ Pa. Then, an argon (Ar) gas is sealed (filled) in the film-forming space 6c. Subsequently, a discharge is generated in the film-forming space 6c to ionize the argon. Then, the ionized argon is made to collide with the target 7, and particles of the material of the target 7 are repelled. The particles repelled in this way adhere to the surface of the molded product 4 to perform the film-forming (step S4 in FIG. 1). By this film-forming process, a film-formed molded product 9 including the molded product 4 and a metal coating film (a metal film, a metallic luster film, or a metal thin film) 14 covering the surface of the molded product 4 is formed. The metal coating film 14 covers a surface on the fixed mold 2 side which is a surface facing the convex mold surface 1a side of the movable mold 1 on the surface of the molded product 4. The metal coating film 14 is made of, for example, stainless steel (SUS), chromium (Cr), aluminum (Al), or the like, and is a film formed in the above film-forming process. When the metal coating film 14 is an aluminum film, from the viewpoint of preventing oxidation of the metal coating film 14, a protective film covering the metal coating film 14 is desirably formed as in Embodiment 2 described later.

From the viewpoint of forming the metal coating film 14 with a uniform and stable film thickness, a distance (a film-forming distance) between the molded product 4 and the target 7 is desirably constant. That is, a surface of the target 7 used for forming the metal coating film 14 and facing the molded product 4 desirably has a three-dimensional shape along the surface of the molded product 4 as a film-forming subject in film formation. Thereby, the metal coating film 14 is formed with the uniform film thickness, and thereby cracks of the metal coating film 14 described later can be formed constantly over the entire metal coating film 14. Therefore, the one that is curved or bent along the surface of the molded product 4 is considered to be used as the target 7.

The metal coating film 14 is formed in a state in which the molded product 4 immediately after the molding process has a temperature (for example, 100° C. or higher) equal to or higher than the temperature (for example, 80 to 95° C.) of the movable mold 1 and the fixed mold 2 raised by the molding process. In other words, after the molding process, the film-forming process of the metal coating film 14 is performed in a state in which the temperature of the molded product 4 is maintained 100° C. or higher. Here, the material used for forming the metal coating film 14 (the material of the target 7) has a coefficient of thermal expansion different from that of the material of the molded product 4. That is, a coefficient of linear expansion (a linear expansion ratio) of the material of the metal coating film 14 is different from a coefficient of linear expansion (a linear expansion ratio) of the molded product 4. For example, the coefficient of thermal expansion of the metal coating film 14 is smaller than the coefficient of thermal expansion of the molded product 4. However, immediately after the film-forming, the temperature of the metal coating film 14 and the temperature of the molded product 4 are approximately the same. In addition, immediately after the film-forming, the metal coating film 14 uniformly covers the surface of the molded product 4 in a wide range. That is, because the metal coating film 14 does not have cracks, the metal coating film 14 is not divided into a plurality of parts (films) that are separated from each other, but is formed in a form of one continuous film. The coefficient of linear expansion is a ratio of an increase amount in a length of a substance when the temperature is raised by 1° C. with respect to an original length, and is about one third of a coefficient of thermal expansion (a coefficient of volume expansion) which represents a change in volume.

Figure 7:
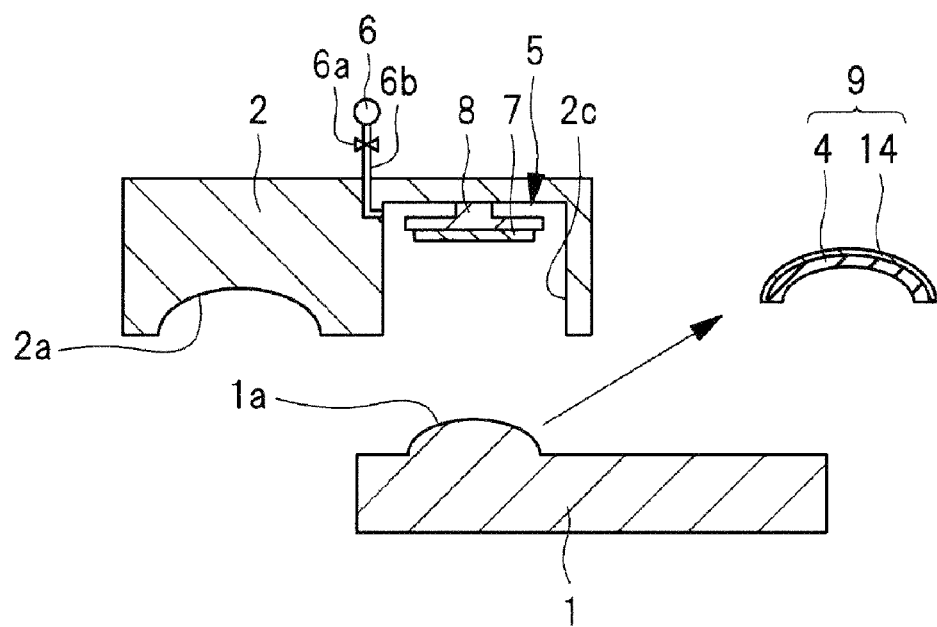
FIG. 7 is a cross-sectional view of the film-formed molded product during the manufacturing process following FIG. 6.
Figure 8:
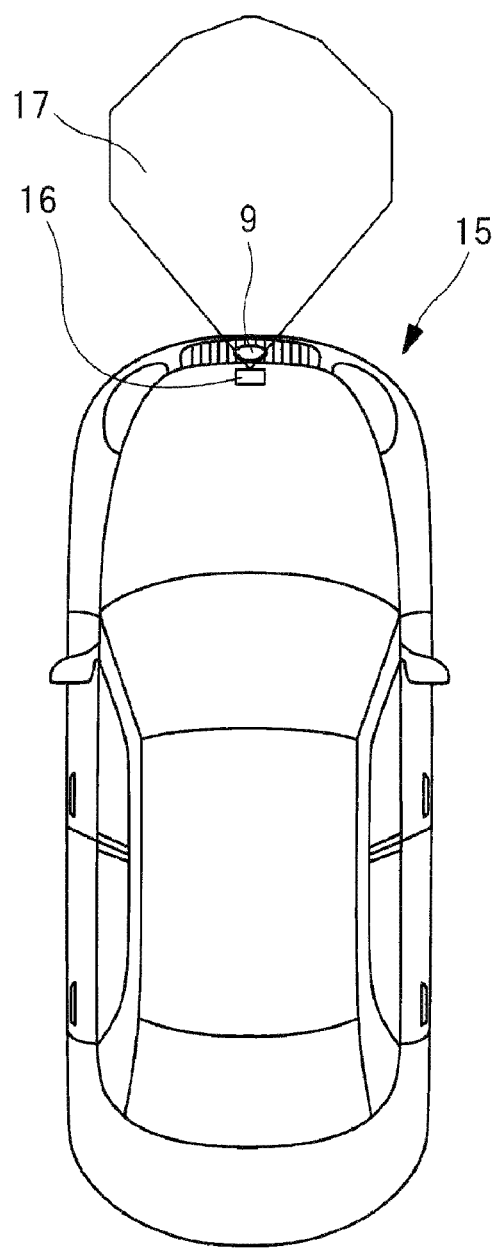
FIG. 8 is a top view transparently showing a part of a vehicle to which the film-formed molded product according to Embodiment 1 of the present invention is attached.

Next, as shown in FIG. 7, the movable mold 1 is separated from the fixed mold 2 (the mold is opened), and the film-formed molded product 9 is taken out from between the movable mold 1 and the fixed mold 2 (step S5 in FIG. 1). By taking out the film-formed molded product 9 from the mold in this way in an environment of room temperature, a temperature of the film-formed molded product 9 is lowered. Subsequently, a heating process of raising the temperature of the film-formed molded product 9 is performed. Then, the film-formed molded product 9 heated in this way and having a raised temperature is returned to the environment of room temperature again, and the temperature of the film-formed molded product 9 is lowered.

Next, a gate (not shown) connected to the film-formed molded product 9 is cut (step S6 in FIG. 1). The gate is a rod-shaped molded product formed in a path for injecting the material for forming the molded product 4 (see FIG. 4) into the gap 4a (see FIG. 3). Although not shown in the flow of FIG. 1, in subsequent processes, a plurality of the formed film-formed molded products 9 are packed in a box and an appearance of the film-formed molded product 9 is inspected. Thereby, the manufacturing process of the film-formed molded product 9 of the embodiment is completed.

Here, the temperature of the film-formed molded product 9 including the metal coating film 14 and the molded product 4 is gradually decreased immediately after the metal coating film 14 is formed, and after the film-formed molded product 9 is taken out from between the movable mold 1 and the fixed mold 2 as described above, this temperature is further decreased faster. When the temperature of the film-formed molded product 9 changes (decreases) in this way, due to a difference between the coefficient of thermal expansion of the metal coating film 14 and the coefficient of thermal expansion of the molded product 4, a thermal stress difference is generated between the metal coating film 14 and the molded product 4, and thereby the cracks are generated on the metal coating film 14. That is, the cracks are generated on the metal coating film 14 when the temperatures of the molded product 4 and the metal coating film 14 are changed after the film forming. That is, the metal coating film 14 covering the surface of the molded product 4 is separated into a plurality of films by alligatoring, and is a discontinuous film having a sea-island structure. Among the materials considered to be used for the molded product 4, for example, a coefficient of linear expansion of the acrylic resin is 4.5 to $7.0 \times 10^{-5}$/° C., and a coefficient of linear expansion of the polycarbonate is $5.6 \times 10^{-5}$/° C. Among the materials considered to be used for the metal coating film 14, for example, a coefficient of linear expansion of the stainless steel is $1.44 \times 10^{-5}$/° C., a coefficient of linear expansion of the chromium is $6.2 \times 10^{-6}$/° C., and a coefficient of linear expansion of the aluminum is $2.4 \times 10^{-5}$/° C.

In addition, as described above, after the film-formed molded product 9 is taken out from the mold, the heating process of raising the temperature of the film-formed molded product 9 is performed, and then the film-formed molded product 9 is cooled in the environment of room temperature. Thereby, the above cracks are generated further remarkably. That is, the cracks are generated due to respective changes in temperature when the temperature of each of the molded product 4 and the metal coating film 14 is raised, and when this temperature is lowered thereafter. However, because the cracks and each of the plurality of films constituting the metal coating film 14 which has the sea-island structure are fine, the cracks and the films are difficult to be visually recognized with a naked eye. That is, even if the metal coating film 14 has the sea-island structure, a metallic luster on the surface of the film-formed molded product 9 is not lost, and a function of the film-formed molded product 9 as a decoration is not impaired.

As shown in FIG. 8, the film-formed molded product 9 formed as described above is an emblem attached to the front of a vehicle 15. That is, the film-formed molded product 9 is used to determine a manufacturer, a vehicle type, or the like of the vehicle 15, and has a decorative effect. The metal coating film 14 shown in FIG. 7 is formed for a purpose of covering the surface of the emblem with a film having a metallic luster. The film-formed molded product 9 is arranged, for example, in the central part of the front grille on a front surface of the vehicle 15, and a radar 16 is arranged on a back side of the film-formed molded product 9, that is, arranged in the vehicle 15 on a side of a surface of the film-formed molded product 9 that is not covered with the metal coating film 14. The radar 16 is a kind of vehicle periphery monitoring device, and is a distance measuring device that oscillates an electromagnetic wave (a microwave), detects a reflection of the electromagnetic wave, and detects an obstacle around the vehicle. When a distance measuring sensor detects an obstacle, the distance measuring sensor warns a driver of the vehicle 15

The radar 16 is, for example, a millimeter wave radar that oscillates a millimeter wave band (a radio wave having a wavelength of 1 to 10 mm). By using the radar 16, the obstacle within a predetermined range (a detection area) 17 shown in FIG. 8 can be detected. Here, when the electromagnetic wave oscillated from the radar is covered with the metal coating film formed uniformly in a wide range, the electromagnetic wave is considered to be blocked by this metal coating film. Thus, as a method for preventing the electromagnetic wave from being blocked, there is a method for arranging the radar at a position in which the radar can be visually recognized from the outside, avoiding the emblem having a metallic luster, the front grille, and the like. However, a designability of an automobile is significantly impaired in this case.

Thus, in the embodiment, the film-formed product 9 having electromagnetic wave transmission is formed, and for example, the radar 16 is arranged on the back side of the film-formed molded product 9 which is the emblem. The metal coating film 14 on the surface of the film-formed molded product 9 shown in FIG. 7 has fine cracks (the alligatoring and through grooves) that are difficult to see with the naked eye, and is configured by a plurality of films separated from each other by the cracks. That is, the metal coating film 14 is a film having the sea-island structure, and does not continuously cover the surface of the molded product 4. That is, the metal coating film 14 is imparted with an electromagnetic wave transmission performance due to the cracks generated after the film forming. Therefore, because there are fine cracks that expose the surface of the molded product 4 between the plurality of films constituting the metal coating film 14, even if the radar is arranged on the back side of the film-formed molded product 9, the electromagnetic wave can be transmitted and received from this radar through the film-formed molded product 9 including the metal coating film 14.

By arranging the radar 16 shown in FIG. 8 on the back side of the film-formed molded product 9, the radar 16 can detect an obstacle in front of the vehicle without impairing the designability of the appearance of the vehicle 15. Thus, a degree of freedom in the position where the radar 16 is arranged can also be increased. Moreover, although described here is that the radar 16 for measuring the distance in front of the vehicle 15 is arranged on the back side of the emblem, a film-formed molded product formed by a manufacturing method of the embodiment may be used for a component other than the emblem, and the radar 16 may be arranged on a back side of the component. In addition, the same radar may also be arranged at an obliquely front corner of the vehicle 15, a side part of the vehicle 15, or the like. In this case, if the film-formed molded product formed by the manufacturing method of the embodiment is used for the component covering this radar, the radar arranged on the back side of the component covered with the film having a metallic luster can be used even at a location other than the front surface of the vehicle 15. That is, the film-formed molded product formed by the manufacturing method of the embodiment can be used for the component (radome) covering the radar and having the metal coating film for decoration.

The occurrence of the cracks becomes more remarkable as the film thickness of the metal coating film 14 shown in FIG. 7 is increased. If the film thickness of the metal coating film 14 exceeds 1500 Å, the cracks or cloudiness on the surface of the metal coating film 14 caused by the occurrence of the cracks can be visually recognized with the naked eye, and the metallic luster of the film-formed molded product 9 is impaired. Thus, the function of the film-formed molded product 9 as a decoration is impaired. In addition, if the film-formed molded product 9 having the film thickness of more than 1500 Å is formed, the time required for the film-forming is excessively long, and a manufacturing cost of the film-formed molded product 9 is increased. In addition, if the film thickness of the metal coating film 14 is less than 800 Å, the cracks are not sufficiently generated, and the film-formed molded product 9 cannot exhibit a sufficient electromagnetic wave transmission performance. Thus, the film thickness of the metal coating film 14 is necessary to be 800 to 1500 Å, and particularly, this film thickness is preferably 1000 Å or more. The film thickness of the metal coating film 14 can be controlled by, for example, changing the time (seconds) for film-forming by a sputtering method.

In the embodiment, when the film-formed molded product 9 is manufactured, the injection molding process of forming the molded product 4 and the film-forming process of forming the metal coating film 14 on the surface of the molded product 4 are continuously performed between the two molds, and the molded product 4 is not necessary to be taken out from between the two molds before the film-forming process. That is, the molded product 4 is always located between the movable mold 1 and the fixed mold 2 from the molding process to the film-forming process. Therefore, as compared with a case where the molded product is once taken out from the mold after the molded product is formed and then the metal coating film is formed on the molded product, the manufacturing process can be simplified and the occurrence of defective products can be prevented.

That is, when the molded product is taken out from the mold after the molded product is formed by performing the injection molding and then the metal coating film is formed with respect to the molded product, the molded product is necessary to be temporarily stored before the film-forming process after the molded product is taken out from the mold. Thus, after the molded product is taken out from the mold, for example, operations are considered to be performed in which the molded product is packed in a box after being put in a bag, transported and stored as in stock, and then transported again and taken out from the box and the bag before the film-forming process. If dust or moisture is adsorbed on the molded product during the operations such as the transport and the like, a film-forming failure may be caused, and thus the molded product is necessary to be subjected to static elimination air cleaning immediately before the film-forming process. In addition, in order to prevent the dust or moisture from being adsorbed on the molded product, the manufacturing using the molding device and the film-forming device and the operations such the transport and the like are considered to be performed in a clean room.

In this way, the molding device and the film-forming device are separately prepared, a belt conveyor, a robot arm, or the like is used to transport the molded product from the molding device to the film-forming device, and a cleaning operation is performed before the molded product is film-formed. If these operations are to be performed in the clean room, the equipment becomes large-scale and time and efforts are also taken for the box packing and the like, and thus there is a problem that the manufacturing cost of the film-formed molded product is increased. In addition, when the molded product is taken out from the mold between the molding process and the film-forming process, because the dust or moisture is adsorbed on the molded product as described above, a yield of the film-formed molded product may be reduced and a reliability of the film-formed molded product may be reduced. In addition, if a person touches the molded product when the molded product is taken out from the molding device and transferred to the film-forming device, the molded product may be stained by a fingerprint or the like or may be scratched, and in this case, a generation ratio of defection is increased.

In addition, a temperature of the interior of the molded product immediately after being taken out from the molding device is 100° C. or higher. However, when the molded product is taken out from the molding device and transferred to the film-forming device, the moisture is likely to be adsorbed on the molded product when the molded product is cooled before the film forming. Thus, when the molded product is transported from the molding device to the film-forming device, it is considered that the temperature of the molded product is maintained or the molded product is heated immediately before being film-formed. In addition, if the temperature of the molded product to be put into the film-forming device is 100° C. or higher, the moisture is desorbed from the molded product, evacuation in the film-forming device can be easily performed. In addition, if the temperature of the molded product at the time of the film forming is high, a film having high adhesion with respect to the molded product can be formed. Therefore, from the viewpoint of performing the evacuation in a short time and improving the adhesion of the metal coating film, the temperature of the molded product transported into the film-forming device is also maintained high. However, maintaining the temperature of the molded product or heating the molded product in this way also causes an increase in the manufacturing cost of the film-formed molded product.

Thus, in the embodiment, as described with reference to FIGS. 1 to 7, the molded product 4 molded by the injection molding is continuously subjected to the film-forming process after being molded without being taken out from between the movable mold 1 and the fixed mold 2, and thereby the film-formed molded product 9 including the metal coating film 14 having excellent electromagnetic wave transmission is formed. That is, the molding device and the film-forming device are not necessary to be separately prepared.

Thereby, the operations from taking out the molded product from the molding device to arranging the molded product in the film-forming device are not required, and an operation efficiency is improved. That is, the operations, such as bag packing, box packing, storage, taking out from the bag, taking out from the box, and the like of the molded product, which are performed from taking out the molded product from the molding device to arranging the molded product in the film-forming device can be omitted. Furthermore, because the molded product 4 is not taken out from the mold, the molded product 4 is not necessary to be cleaned before the film-forming process, and there is no need to prepare a device for cleaning. In addition, because the film-forming can be performed immediately after the molding process, the interior of the molded product 4 is maintained at a temperature of 100° C. or higher, and because the temperature of the surface of the molded product 4 is maintained at 80 to 95° C. or higher by the movable mold 1 and the fixed mold 2 having a temperature of 80 to 95° C. or higher, almost no moisture is adsorbed on the surface of the molded product 4. Therefore, the evacuation in the concave mold surface 2c performed in the film-forming process can be easily performed in a short time. In addition, by maintaining the temperature of the molded product 4 high, the metal coating film 14 having relatively high adhesion can be formed in the film-forming process. In addition, because the molded product 4 is not taken out from the mold, the molding process and the film-forming process are not necessary to be performed in the clean room, and the equipment such as the belt conveyor, the robot arm, or the like is also not required.

Therefore, in the embodiment, the equipment required for the manufacturing process of the film-formed molded product 9 can be miniaturized and simplified, and the operations required for manufacturing can be simplified. Thus, the manufacturing cost of the film-formed molded product 9 can be significantly reduced. In addition, the dust or moisture can be prevented from being adsorbed on the molded product 4, and furthermore, because the molded product 4 is not stained and scratched due to that a person touches the molded product 4 by hand, the occurrence of the defective product can be significantly reduced. Therefore, the yield and the reliability of the film-formed molded product 9 can be improved.

In addition, in the manufacturing device used in the manufacturing process of the film-formed molded product of the embodiment, the concave mold surface 2c in which a main body of the sputtering device 5 is accommodated is formed in the fixed mold (second mold) 2. Therefore, the sputtering device 5 is fixed, and a pump piping, a wiring, and the like arranged in the sputtering device 5 are not necessary to be configured considering the movement as arranged on the movable mold 1 side, which can improve durability along with simplification of the structure.

In addition, indium (In) is considered to be used as the material of the metal coating film having the sea-island structure, but the indium is a relatively expensive material. In addition, a method for forming an indium coating film by a vapor deposition method has a problem that the yield is low and a problem that the time required for film molding is relatively long. In the embodiment, the metal coating film 14 having the sea-island structure is formed using a material (the stainless steel, the chromium, or the aluminum) which is cheaper than the indium, and thereby the yield can be improved, the time required for the film molding can be shortened, and the manufacturing cost of the film-formed molded product can be reduced.

In addition, although the performing of the injection molding as the molding process of the molded product 4 has been described here, the present invention is not limited hereto, and for example, the molded product 4 may be molded by mold molding such as press molding, blow molding, or the like.

In addition, although the use of the sputtering device 5 as the film-forming part (the film-forming device and the film-forming way) has been described here, instead of the sputtering device 5, a vacuum vapor deposition device or the like may be incorporated into the fixed mold 2, and the metal coating film 14 may be formed by forming a film on the molded product 4 by the vapor deposition method. In addition, as the film-forming part, an ion plating device may be used instead of the sputtering device 5.

The vapor deposition method is a method in which an electronic beam is irradiated to a material for coating film or heat is applied to this material in a vacuum, and thereby a film is formed on a film-forming subject. In this case, for example, the material irradiated with the electronic beam is decomposed to a molecular level, slowly moves in the vacuum, and is deposited on the surface of the film-forming subject, and thereby the film-forming is performed. When the film-forming is performed by the vapor deposition method, an atmospheric pressure in the film-forming space 6c shown in FIG. 6 is, for example, $10^{-8}$ Pa.

An ion plating method using the ion plating device includes a wet plating method of forming a film in a solution in which a metal is dissolved or the like, and a dry plating method of forming a film in a vacuum or the like. The ion plating method which is the dry plating method is a film-forming method based on almost the same principle as the vapor deposition method, but vaporized particles are made to carry a positive charge by passing through a plasma, and a negative charge is applied to the film-forming subject, and thereby the vaporized particles can be attracted to the film-forming subject and deposited to form the film. Thereby, a film having higher adhesion can be produced as compared with the vapor deposition method. When the film-forming is performed by the ion plating method, the atmospheric pressure in the film-forming space 6c shown in FIG. 6 is, for example, $10^{-3}$ Pa.

In addition, although the case where the two molds are used has been described here, in a case of molding a molded product that has a complicated shape and cannot be molded by the two molds, the number of molds can be increased if necessary, for example, a third mold and the like are further used.

In addition, as shown in FIGS. 2 to 7, the convex mold surface 1a is formed in the movable mold 1 and the concave mold surface 2a is formed in the fixed mold 2, but on the contrary, a concave mold surface may be formed in the movable mold 1 and a convex mold surface may be formed in the fixed mold 2. In addition, because the surface of either of the movable mold 1 and the fixed mold 2 is flat, a surface of the formed molded product 4 on this mold side may be flat.

Embodiment 2

In the above Embodiment 1, the film-forming of one metal coating film on the molded product has been described, but in the following, it is described with reference to FIGS. 9 to 12 that film-forming is further performed on this metal coating film. FIGS. 9 to 12 are cross-sectional views of a film-formed molded product of the embodiment during the manufacturing process.

Figure 9:
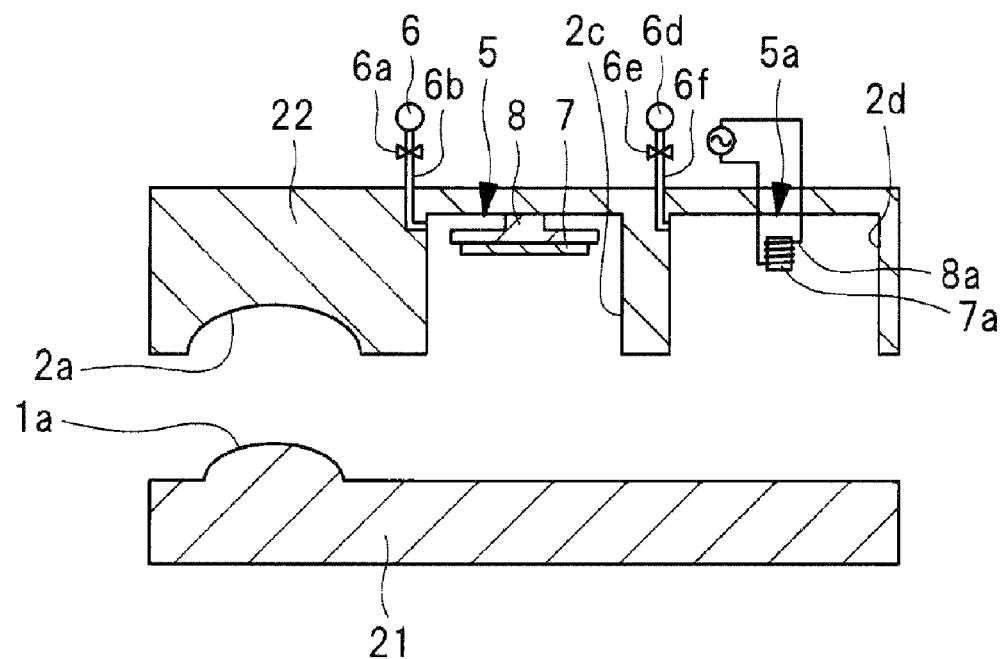
FIG. 9 is a cross-sectional view of a film-formed molded product according to Embodiment 2 of the present invention during a manufacturing process.

As shown in FIG. 9, a manufacturing device of the film-formed molded product of the embodiment has a movable mold 21 and a fixed mold 22 facing each other. The convex mold surface 1a for forming the outer surface of the molded product 4 (see FIG. 10) is formed on one surface (upper surface) of the movable mold 21 facing the fixed mold 22. In addition, the concave mold surface 2a for forming the inner surface of the molded product 4, the concave mold surface 2c for accommodating (internally mounting) the sputtering device 5 which is a first film-forming part (the film-forming device or film-forming way), and a concave mold surface 2d for accommodating (internally mounting) a vacuum vapor deposition device 5a which is a second film-forming part (the film-forming device or the film-forming way) are formed side by side on one surface (lower surface) of the fixed mold 22 facing the movable mold 21.

That is, the configuration is different from the fixed mold of the above Embodiment 1 in that the fixed mold 22 further has the vacuum vapor deposition device 5a and the concave mold surface 2d. The vacuum vapor deposition device 5a includes a vacuum pump 6d, a vacuum flow path 6f connected to the vacuum pump 6d via an on-off valve 6e, a boat (container) 7a in which a target that is the film-forming material (raw material) is put, and a heater 8a for heating the boat 7a. The film-forming material put into the boat 7a is, for example, aluminum oxide ($Al_2O_3$), magnesium fluoride ($MgF_2$), silicon oxide ($SiO_2$), or the like. Moreover, each of the first film-forming part and the second film-forming part may be evacuated using the same vacuum pump.

Figure 10:
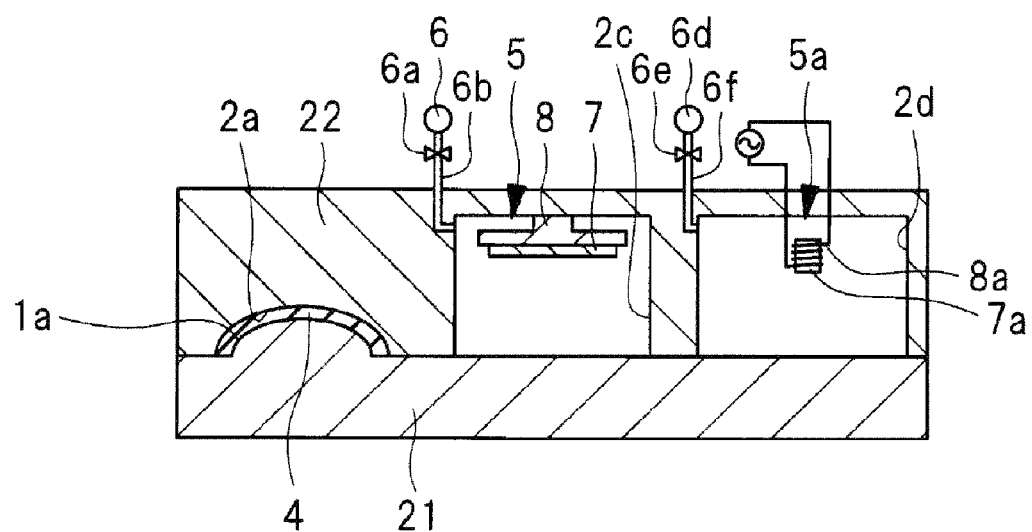
FIG. 10 is a cross-sectional view of the film-formed molded product during the manufacturing process following FIG. 9.
Figure 11:
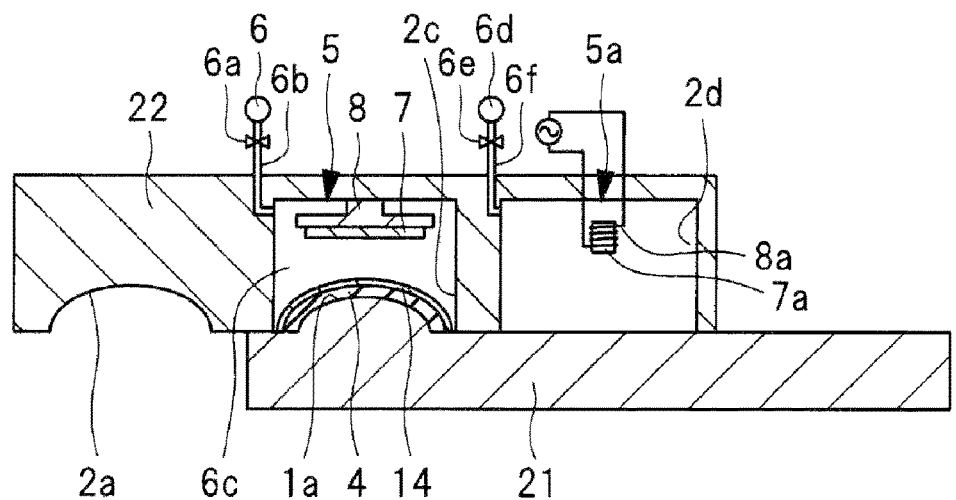
FIG. 11 is a cross-sectional view of the film-formed molded product during the manufacturing process following FIG. 10.

In the manufacturing process of the film-formed molded product of the embodiment, first, the same processes as the processes described with reference to FIGS. 2 to 4 are performed, and thereby the molded product 4 is injection-molded in the gap between the convex mold surface 1a and the concave mold surface 2a as shown in FIG. 10.

Next, the same processes as the processes described with reference to FIGS. 5 to 6 are performed, and thereby the metal coating film 14 is formed on the surface of the molded product 4 in the film-forming space 6c sealed by the movable mold 21 and the concave mold surface 2c. Here, the target 7 and the metal coating film 14 are made of, for example, aluminum (Al).

Figure 12:
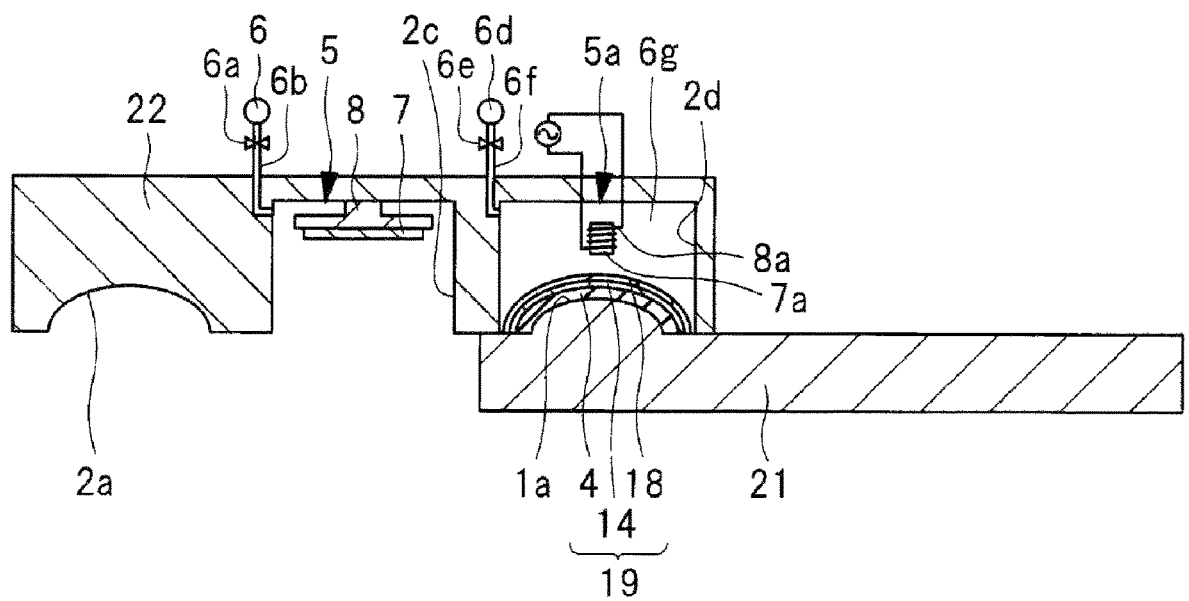
FIG. 12 is a cross-sectional view of the film-formed molded product during the manufacturing process following FIG. 11.

Next, as shown in FIG. 12, the second film-forming part is used to form a protective film 18 on the surface of the metal coating film 14 covering the molded product 4. That is, first, a mold release (mold opening) process is performed in which the movable mold 21 moves in a direction where the movable mold 21 is mold-released from the fixed mold 22 (the mold is opened). At this time, the molded product 4 is supported on the movable mold 21 side without being removed from the mold. Subsequently, the movable mold 21 moves in parallel in a manner that the molded product 4 faces the vacuum vapor deposition device 5a. Subsequently, the movable mold 21 and the fixed mold 22 are in a mold-clamped state by moving the movable mold 21 to the fixed mold 22 side, and a film-forming space 6g between the inside of the concave mold surface 2d and the molded product 4 is isolated from outside air and sealed. The film-forming space 6g is an enclosed space surrounded by the movable mold 21 and the concave mold surface 2d of the fixed mold 22 in a manner that the movable mold 21 and the fixed mold 22 are in close contact with each other.

Subsequently, the on-off valve 6e is opened to remove air in this film-forming space 6g through the vacuum flow path 6f, and thereby the inside of the film-forming space 6g is made a vacuum state. At this time, an atmospheric pressure in the film-forming space 6g is, for example, $10^{-8}$ Pa. Then, the melted material supplied to the boat 7a is vaporized by the heated heater 8a, and the protective film 18 which is a vacuum vapor deposition film is formed on the surface of the metal coating film 14 covering the molded product 4. That is, the surface of the molded product 4 is covered with the protective film 18 via the metal coating film 14. Thereby, a film-formed molded product 19 including the molded product 4, the metal coating film 14, and the protective film 18 can be formed. The protective film 18 is made of, for example, aluminum oxide ($Al_2O_3$), magnesium fluoride ($MgF_2$), silicon oxide ($SiO_2$), or the like. When the metal coating film 14 is a film that is likely to be oxidized such as the aluminum film or the like, the metal coating film 14 is preferably covered by the protective film 18 as in the embodiment.

Subsequently, after the movable mold 21 is separated from the fixed mold 22 (the mold is opened) and the film-formed molded product 19 is taken out from the mold, a heating process of raising the temperature of the film-formed molded product 19 is performed. Thereby, the manufacturing process of the film-formed molded product 19 of the embodiment is completed.

Here, the cracks are also generated on the metal coating film 14 due to the temperature change of the film-formed molded product 19. In the embodiment, after the molded product 4 is formed, the molded product 4 is not necessary to be taken out from the mold before the film-forming process of the metal coating film 14, and thus the same effect as that of the above Embodiment 1 can be obtained. In addition, after the metal coating film 14 is formed, the molded product 4 is not necessary to be taken out from the mold before the protective film 18 is formed, and thus the equipment and the operation for transporting the molded product 4 covered by the metal coating film 14 can be omitted. In addition, the dust and moisture can be prevented from adhering to the molded product 4 covered by the metal coating film 14, and the clean room and a cleaning device are not necessary to be prepared. Thus, the manufacturing cost of the film-formed molded product 19 can be reduced.

When the protective film 18 is made of a material such as a metal or the like that blocks the electromagnetic wave, the cracks are also generated on the protective film 18 the same as in the metal coating film 14. Thereby, the electromagnetic wave can be prevented from being blocked by the film-formed molded product 19. Moreover, when the protective film 18 is not a metal film, that is, when the protective film 18 is a film having an electromagnetic wave transmission performance, no crack may be generated on the protective film 18.

Modification Example 1

Figure 13:
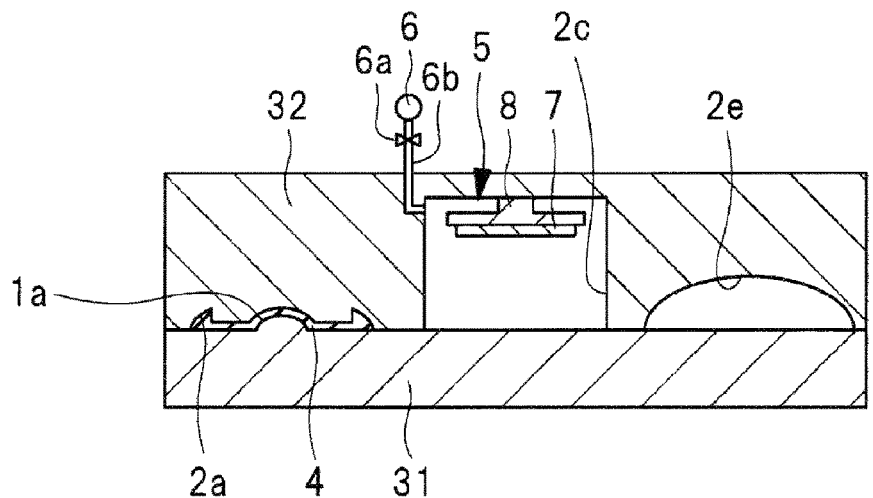
FIG. 13 is a cross-sectional view of a film-formed molded product according to Modification example 1 of Embodiment 2 of the present invention during a manufacturing process.
Figure 14:
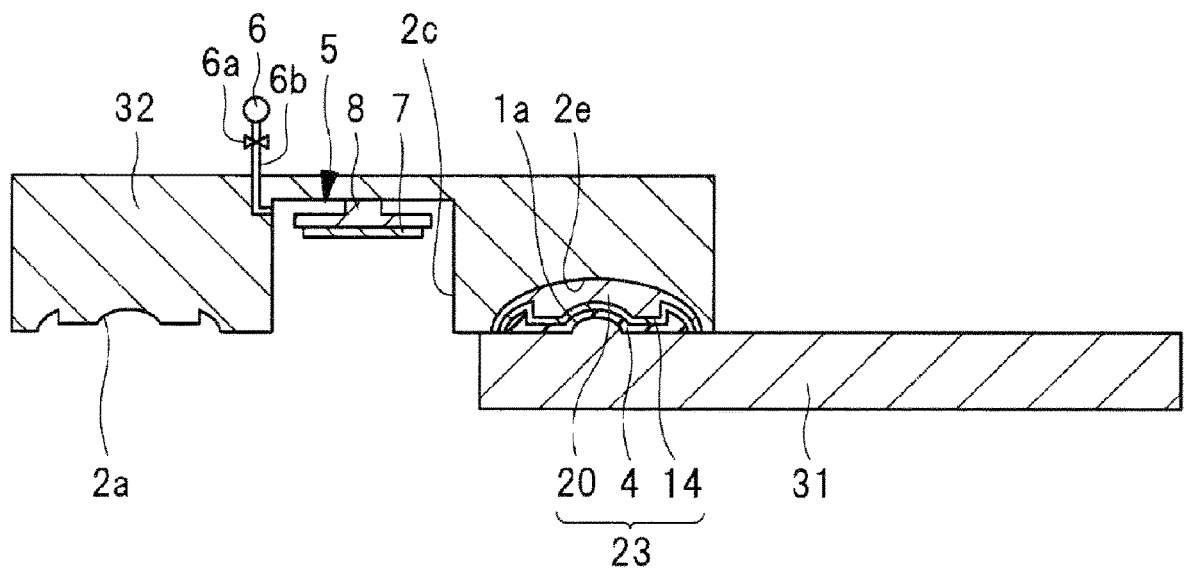
FIG. 14 is a cross-sectional view of the film-formed molded product during the manufacturing process following FIG. 13.

In the above Embodiment 1, the film-forming of one metal coating film on the molded product has been described, but in the following, it is described with reference to FIGS. 13 and 14 that injection molding is further performed on this metal coating film. FIGS. 13 and 14 are cross-sectional views of a film-formed molded product of Modification example 1 of the embodiment during the manufacturing process.

As shown in FIG. 13, a manufacturing device of the film-formed molded product of the embodiment has a movable mold 31 and a fixed mold 32 facing each other. The convex mold surface 1a for forming the outer surface of the molded product 4 is formed on one surface (upper surface) of the movable mold 31 facing the fixed mold 32. In addition, the concave mold surface 2a for forming the inner surface of the molded product 4, the concave mold surface 2c for accommodating the sputtering device 5 which is the film-forming part, and a concave mold surface 2e for further forming a molded product 20 (see FIG. 14) on the molded product 4 are formed side by side on one surface (lower surface) of the fixed mold 32 facing the movable mold 31. The concave mold surface 2a constitutes a first molding part, and the concave mold surface 2e constitutes a second molding part.

That is, the configuration of the modification example is different from the above Embodiment 1 in that the fixed mold 32 further has the concave mold surface 2e for molding as the second molding part.

In the manufacturing process of the film-formed molded product of the embodiment, first, the same processes as the processes described with reference to FIGS. 2 to 4 are performed, and thereby the molded product 4 is injection-molded in the gap between the convex mold surface 1a and the concave mold surface 2a as shown in FIG. 13. Moreover, although FIG. 13 shows the molded product 4 having a cross-sectional shape different from that of the above embodiment, the shape of the molded product 4 may be the same as that of the above Embodiment 1.

Next, although not shown, the same film-forming process as the process described with reference to FIGS. 5 and 6 is performed, and thereby the metal coating film 14 covering the surface of the molded product 4 is formed.

Next, as shown in FIG. 14, after the movable mold 31 and the fixed mold 32 are separated from each other, by moving the movable mold 31 laterally, the convex mold surface 1a and the concave mold surface 2e face each other, and subsequently, by moving the movable mold 31 to the fixed mold 32 side, the convex mold surface 1a and the concave mold surface 2e facing each other are mold-matched (mold-clamped). At this time, between the convex mold surface 1a and the concave mold surface 2e, there are the molded product 4 in contact with the convex mold surface 1a, the metal coating film 14 covering the molded product 4, and a gap (a space) between the concave mold surface 2e, and the molded product 4 and the metal coating film 14.

Subsequently, in the mold-clamped state, a material is injected into this gap, and the material is cooled in a state of being applied with a pressure until the material is hardened. By cooling and harden the material, the molded product 20 made of this material is molded, and thereby, a film-formed molded product 23 including the molded product 4, the metal coating film 14, and the molded product 20 is formed. The molded product 20 covers the surface of the molded product 4 via the metal coating film 14. As this material constituting the molded product 20, for example, a transparent material such as polycarbonate, acrylic resin, or the like can be used.

Subsequently, after the movable mold 31 is separated from the fixed mold 32 (the mold is opened) and the film-formed molded product 23 is taken out from the mold, a heating process of raising a temperature of the film-formed molded product 23 is performed. Thereby, the manufacturing process of the film-formed molded product 23 of the embodiment is completed. Here, no crack is generated on the metal coating film 14 when the metal coating film 14 is formed, but the cracks are generated on the metal coating film 14 due to a fluctuation in the temperatures of the metal coating film 14 and the molded product 4 after the film forming.

In the modification example, for example, the emblem having the metal coating film can further be covered by the molded product including a transparent resin. In this case, after the molded product 4 is formed, the molded product 4 is not necessary to be taken out from the mold before the film-forming process of the metal coating film 14, and thus the same effect as that of the above Embodiment 1 can be obtained. In addition, after the metal coating film 14 is formed, the molded product 4 is not necessary to be taken out from the mold before the molded product 20 is formed, and thus the equipment and the operation for transporting the molded product 4 covered by the metal coating film 14 can be omitted. In addition, the dust and moisture can be prevented from adhering to the molded product 4 covered by the metal coating film 14, and the clean room and the cleaning device are not necessary to be prepared. Thus, the manufacturing cost of the film-formed molded product 23 can be reduced.

Modification Example 2

Hereinafter, it is described with reference to FIGS. 15 to 18 that the processes described with reference to FIGS. 9 to 12 are performed using a movable mold that rotates around an axis. FIGS. 15 to 18 are perspective views of a film-formed molded product of Modification example 2 of the embodiment during the manufacturing process. In the perspective views shown in FIGS. 15 to 18, a recessed part formed on the lower surface side of a fixed mold is transparently shown. In addition, in FIGS. 15 to 18, in order to make the drawings easy to understand, the recessed part (concave mold surface) formed on a bottom surface of the fixed mold is transparently shown, and a hatching is further added to each of the molded product and the film covering the molded product. In addition, in FIGS. 15 to 18, each of the sputtering device 5 accommodated in the concave mold surface 2c and the vacuum vapor deposition device 5a accommodated in the concave mold surface 2d are not shown.

Figure 15:
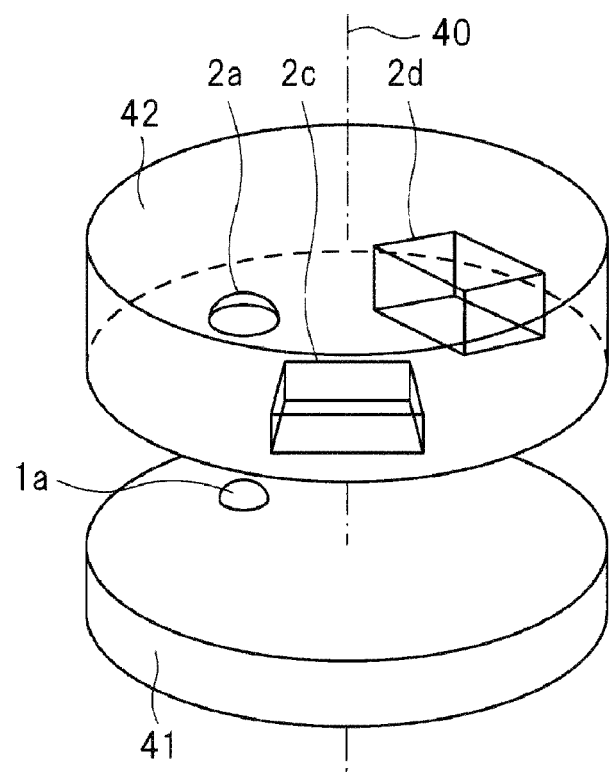
FIG. 15 is a perspective view of a film-formed molded product according to Modification example 2 of Embodiment 2 of the present invention during a manufacturing process.

As shown in FIG. 15, a manufacturing device of the film-formed molded product of the embodiment has a movable mold 41 and a fixed mold 42 facing each other. The movable mold 41 and the fixed mold 42 have a circular shape in a plan view with each other, and central axes 40 of each of the circles overlap each other in a plan view. In FIG. 15, this central axis (rotation axis) 40 is shown in a dot dash line. The fixed mold 42 on the upper side is fixed, but the movable mold 41 on the lower side is arranged, for example, on a turntable (not shown), and can rotate around the central axis 40.

The convex mold surface 1a for forming the outer surface of the molded product 4 (see FIG. 10) is formed on one surface (upper surface) of the movable mold 41 facing the fixed mold 42. In addition, the concave mold surface 2a for forming the inner surface of the molded product 4, the concave mold surface 2c for accommodating the sputtering device 5 which is the first film-forming part (the film-forming device or the film-forming way), the concave mold surface 2d for accommodating the vacuum vapor deposition device 5a which is the second film-forming part are formed side by side along a circle centered on the central axis 40 on one surface (lower surface) of the fixed mold 42 facing the movable mold 41. Specifically, the concave mold surface 2a is arranged at a first position that overlaps this circle, the concave mold surface 2c is arranged at a second position that overlaps this circle, and the concave mold surface 2d is arranged at a third position that overlaps this circle. The first position, the second position, and the third position have, in a plan view, a 120-degree relationship with each other using the central axis 40 as an apex.

That is, in a plan view, an angle between a line connecting the first position where the concave mold surface 2a is arranged and the central axis 40 and a line connecting the second position where the concave mold surface 2c is arranged and the central axis 40 is 120 degrees. Similarly, an angle between the line connecting the first position where the concave mold surface 2a is arranged and the central axis 40 and a line connecting the third position where the concave mold surface 2d is arranged and the central axis 40 is 120 degrees. Thus, an angle between the line connecting the second position where the concave mold surface 2c is arranged and the central axis 40 and the line connecting the third position where the concave mold surface 2d is arranged and the central axis 40 is 120 degrees.

The movable mold 41 has a function of reciprocating and rotating between three locations (stop positions) in which a fourth position where the convex mold surface 1a is formed overlaps with each of the first position, the second position, and the third position in a plan view. In other words, the movable mold 41 can reciprocate and rotate by 120 degrees in a manner that the fourth position where the convex mold surface 1a is formed is moved directly below each of the concave mold surfaces 2a, 2c, and 2d.

In the manufacturing process of the film-formed molded product of the embodiment, first, as shown in FIG. 15, the movable mold 41 and the fixed mold 42 in a state of being separated from each other (a state of being mold-opened) are prepared. At this time, the convex mold surface 1a in the fourth position is located directly below the concave mold surface 2a in the first position.

Figure 16:
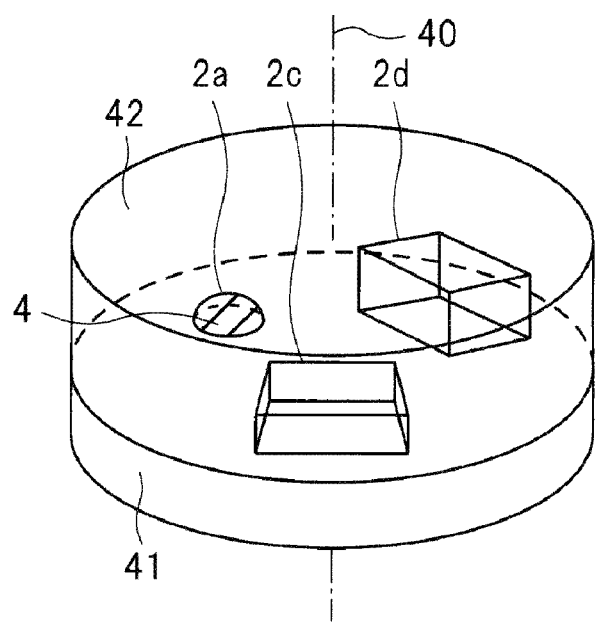
FIG. 16 is a perspective view of the film-formed molded product during the manufacturing process following FIG. 15.

Next, as shown in FIG. 16, the movable mold 41 and the fixed mold 42 are mold-clamped, and the molded product 4 is injection-molded in the gap between the convex mold surface 1a (see FIG. 15) and the concave mold surface 2a.

Figure 17:
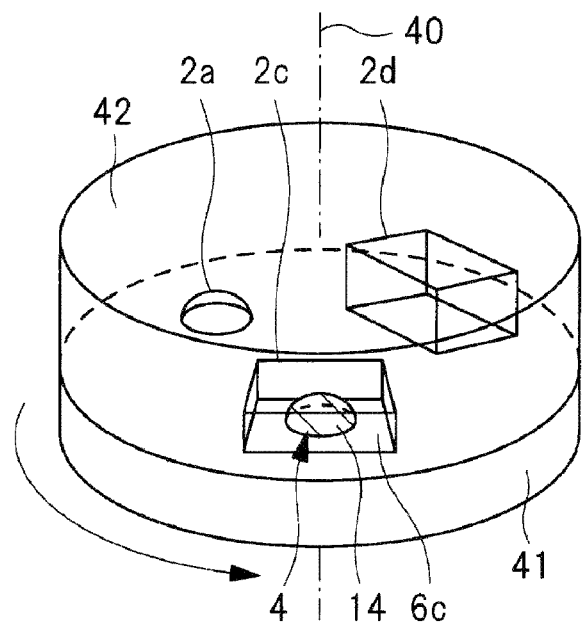
FIG. 17 is a perspective view of the film-formed molded product during the manufacturing process following FIG. 16.

Next, as shown in FIG. 17, after the movable mold 41 and the fixed mold 42 are separated from each other and the mold is opened, the movable mold 41 is rotated by 120 degrees, and the convex mold surface 1a (see FIG. 15) in the fourth position is moved directly below the concave mold surface 2c in the second position. At this time, the molded product 4 is supported (fixed) on the movable mold 41 side without being removed from the mold. That is, the movable mold 41 is rotated so as to move the molded product 4 directly below the concave mold surface 2c, and then the movable mold 41 is stopped. Subsequently, the movable mold 41 and the fixed mold 42 are brought into a mold-clamped state, the same process as the process described with reference to FIG. 6 is performed, and thereby the metal coating film 14 is formed on the surface of the molded product 4 in the film-forming space 6c sealed by the movable mold 41 and the concave mold surface 2c.

Figure 18:
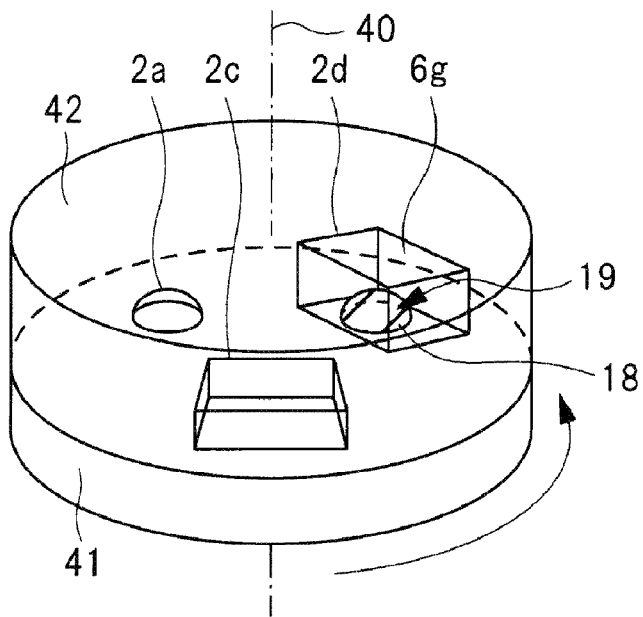
FIG. 18 is a perspective view of the film-formed molded product during the manufacturing process following FIG. 17.

Next, as shown in FIG. 18, the second film-forming part is used to form the protective film 18 on the surface of the metal coating film 14 (see FIG. 17) covering the molded product 4 (see FIG. 16). That is, first, after the movable mold 41 and the fixed mold 42 are separated from each other and the mold is opened, the movable mold 41 is rotated by 120 degrees, and the convex mold surface 1a (see FIG. 15) in the fourth position is moved directly below the concave mold surface 2d in the second position. At this time, the molded product 4 is supported (fixed) on the movable mold 41 side without being removed from the mold. That is, the movable mold 41 is rotated so as to move the molded product 4 directly below the concave mold surface 2d, and then the movable mold 41 is stopped. Subsequently, the movable mold 41 and the fixed mold 42 are brought into a mold-clamped state, the same process as the process described with reference to FIG. 12 is performed, and thereby the protective film 18 covering the surface of the molded product 4 via the metal coating film 14 is formed in the film-forming space 6g sealed by the movable mold 41 and the concave mold surface 2d. Thereby, the film-formed molded product 19 including the molded product 4, the metal coating film 14, and the protective film 18 can be formed.

Subsequently, after the movable mold 41 is separated from the fixed mold 42 (the mold is opened) and the film-formed molded product 19 is taken out from the mold, the heating process of raising the temperature of the film-formed molded product 19 is performed. Thereby, the manufacturing process of the film-formed molded product 19 of the embodiment is completed. By the method for manufacturing the film-formed molded product of the modification example, the same effect as that of the embodiment described with reference to FIG. 9 to FIG. 12 can be obtained.

In the modification example, the case is described where the molding process, the film-forming process and the film-forming process are sequentially performed in the same manner as in the embodiment described with reference to FIG. 9 to FIG. 12, but obviously the present invention is not limited to the above-described embodiment, and various modifications can be made without departing from the gist thereof.

For example, a set of molds that fit each other does not necessarily have a fixed mold. That is, a set of molds that fit each other may have a plurality of movable molds.

INDUSTRIAL APPLICABILITY

The present invention can be widely used in a method for manufacturing a film-formed molded product having electromagnetic wave transmission.

What is claimed is:

1. A method for manufacturing a film-formed molded product which comprises a non-conductive first molded product and a metal coating film that covers the first molded product and has an electromagnetic wave transmission performance, comprising:
- a process (a) in which a first mold and a second mold are mold-clamped, a first material is injected into a first space between the first mold and the second mold, and thereby the first molded product comprising the first material is formed;
- a process (b) in which after the first mold and the second mold are mold-opened, the first molded product is moved with respect to the second mold between the first mold and the second mold; and
- a process (c) in which after the process (b), the first mold and the second mold are mold-clamped, and the metal coating film is formed on a surface of the first molded product by a first film-forming part comprised in the second mold,
- a process (c1) in which after the process (c), the first mold and the second mold are mold-opened, the first molded product is moved with respect to the second mold, the first mold and the second mold are mold-clamped at a second film-forming part formed adjacent to the first film-forming part, and a protective film made of aluminum oxide, magnesium fluoride or silicon oxide is formed on a surface of the metal coating film;
- a process (d) in which after the process (c1), the first molded product, the metal coating film and the protective film are heated;
- wherein cracks are generated on the metal coating film when temperatures of the first molded product, the metal coating film and the protective film are changed after the process (d), and thereby an electromagnetic wave transmission performance is imparted to the metal coating film and the protective film,
- wherein the first film-forming part comprises a sputtering device,
- a target disposed opposite to the first molded product for forming the metal coating film is curved or bent along a surface of the first molded product.

2. The method for manufacturing a film-formed molded product according to claim 1, wherein
the first molded product is located between the first mold and the second mold from the process (a) to the process (d).

3. The method for manufacturing a film-formed molded product according to claim 1, wherein
the first material and a second material which constitutes the metal coating film have coefficients of thermal expansion different from each other.

4. The method for manufacturing a film-formed molded product according to claim 1, wherein
after being formed in the process (a), the first molded product is maintained at a temperature of 100° C. or higher until the metal coating film is formed in the process (c).

5. The method for manufacturing a film-formed molded product according to claim 1, wherein
in the process (b) to the process (c1), the first molded product supported by the first mold is moved by rotating the first mold.

6. The method for manufacturing a film-formed molded product according to claim 1, wherein
a film thickness of the metal coating film is 800 to 1500 Å.

7. The method for manufacturing a film-formed molded product according to claim 1, wherein
a second material constituting the metal coating film is stainless steel, chromium, or aluminum.

* * * * *